(12) United States Patent
Tamai et al.

(10) Patent No.: US 9,611,406 B2
(45) Date of Patent: Apr. 4, 2017

(54) POLISHING COMPOSITION, AND POLISHING METHOD AND SUBSTRATE PRODUCTION METHOD USING SAME

(71) Applicant: FUJIMI INCORPORATED, Kiyosu-shi, Aichi (JP)

(72) Inventors: Kazusei Tamai, Kiyosu (JP); Keiji Ashitaka, Kiyosu (JP); Shogo Tsubota, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 168 days.

(21) Appl. No.: 14/363,060

(22) PCT Filed: Nov. 15, 2012

(86) PCT No.: PCT/JP2012/079698
§ 371 (c)(1),
(2) Date: Jun. 5, 2014

(87) PCT Pub. No.: WO2013/084686
PCT Pub. Date: Jun. 13, 2013

(65) Prior Publication Data
US 2014/0335762 A1     Nov. 13, 2014

(30) Foreign Application Priority Data

Dec. 9, 2011 (JP) .................................. 2011-270621

(51) Int. Cl.
*C09G 1/02* (2006.01)
*B24B 37/04* (2012.01)
(Continued)

(52) U.S. Cl.
CPC .............. *C09G 1/02* (2013.01); *B24B 37/044* (2013.01); *C09K 3/1409* (2013.01); *C09K 3/1463* (2013.01); *H01L 21/31053* (2013.01)

(58) Field of Classification Search
CPC ...... C09G 1/02; B24B 37/044; C01K 3/1409; C01K 3/1463; H01L 21/31053
(Continued)

(56) References Cited

U.S. PATENT DOCUMENTS

| 2008/0053001 A1 | 3/2008 | Noguchi et al. |
| 2011/0209413 A1 | 9/2011 | Nishida et al. |
| 2013/0199106 A1 | 8/2013 | Ashitaka et al. |

FOREIGN PATENT DOCUMENTS

| CN | 103260827 A | 8/2013 |
| JP | 2007-153732 A | 6/2007 |

(Continued)

OTHER PUBLICATIONS

K. Tamai et al., "Analysis of Polishing Friction Factor for Material Removal Rate Improvement in CMP", Sentan Kako, Jul. 1, 2011, vol. 29, No. 1, pp. 53-59.

*Primary Examiner* — Robert Rose
(74) *Attorney, Agent, or Firm* — Foley & Lardner LLP

(57) ABSTRACT

A polishing composition of the present invention contains abrasive grains each having a surface with protrusions. Parts of the abrasive grains have larger particle diameters than the volume-based average particle diameter of the abrasive grains, and the average of values respectively obtained by dividing a height of each protrusion on the surface of each abrasive grain belonging to the parts of the abrasive grains by the width of a base portion of the same protrusion is 0.170 or more. Protrusions on the surfaces of abrasive grains belonging to the parts of the abrasive grains that have larger particle diameters than the volume-based average particle diameter of the abrasive grains have an average height of 3.5 nm or more. The polishing composition has a content of an organic alkali of 100 mmol or less per kilogram of the abrasive grains in the polishing composition.

12 Claims, 2 Drawing Sheets

(51) Int. Cl.
*H01L 21/3105* (2006.01)
*C09K 3/14* (2006.01)

(58) Field of Classification Search
USPC .................. 451/41, 28, 37; 51/308; 252/79.1
See application file for complete search history.

(56) References Cited

FOREIGN PATENT DOCUMENTS

| | | | |
|---|---|---|---|
| JP | 2009-149493 | A | 7/2009 |
| TW | 200813206 | A | 3/2008 |

Fig.1
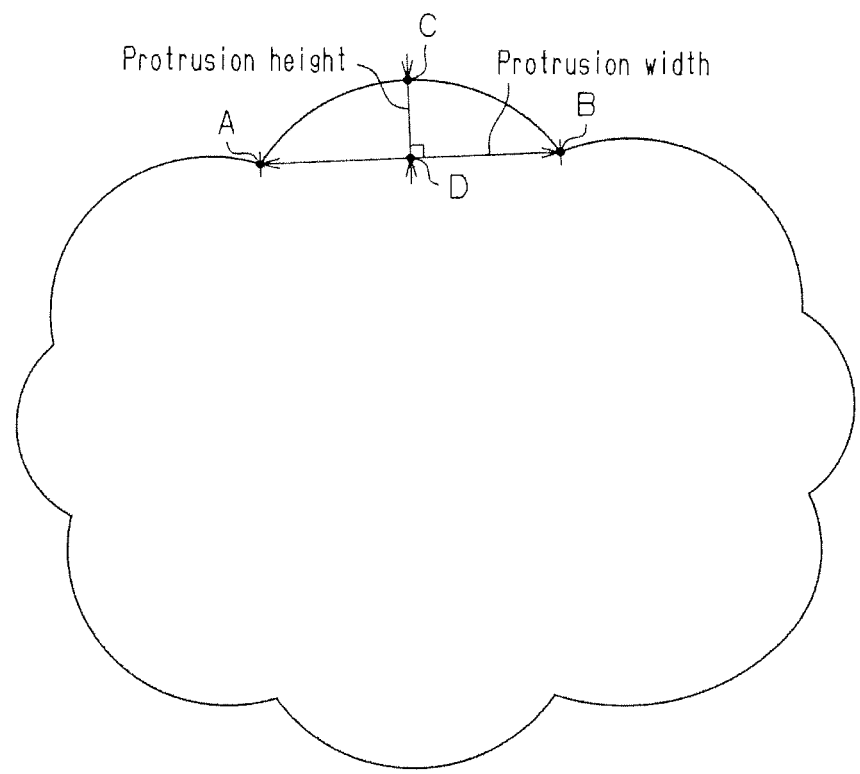
Fig.2(a)    Fig.2(b)
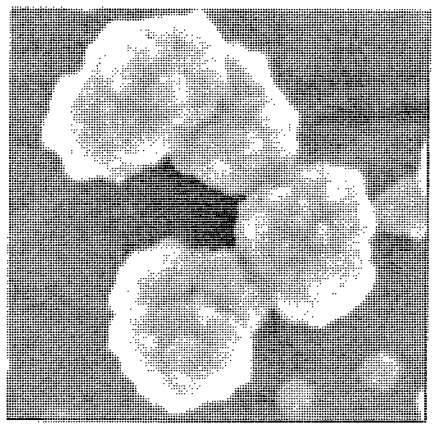    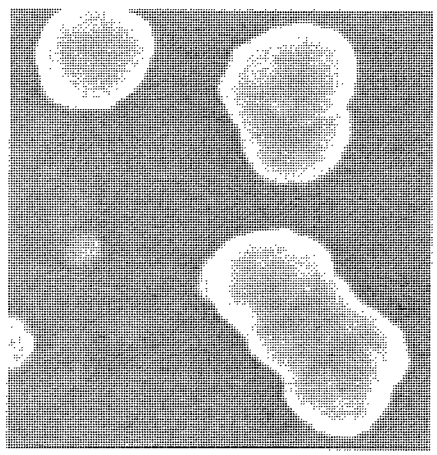

POLISHING COMPOSITION, AND POLISHING METHOD AND SUBSTRATE PRODUCTION METHOD USING SAME

TECHNICAL FIELD

The present invention relates to a polishing composition containing abrasive grains having protrusions on each surface thereof. The present invention also relates to a polishing method and substrate production method using the polishing composition.

BACKGROUND ART

Using non-spherical particles as abrasive grains in a polishing composition is effective as a way of enhancing the rate of polishing with the polishing composition. Japanese Laid-Open Patent Publication No. 2007-153732 (Patent document 1) discloses the use of colloidal silica particles having a number of small protrusions on each surface thereof in mirror polishing of a silicon wafer. Japanese Laid-Open Patent Publication No. 2009-149493 (Patent document 2) discloses a polishing composition in which silica sol containing silica particles having a minor axis/major axis ratio in the range of 0.01 to 0.8 and having wart-like protrusions on each surface thereof is used as abrasive grains.

PRIOR ART DOCUMENTS

Patent document 1: Japanese Laid-Open Patent Publication No. 2007-153732
Patent document 2: Japanese Laid-Open Patent Publication No. 2009-149493

SUMMARY OF THE INVENTION

Problems that the Invention is to Solve

The inventors of the present invention have repeated experiments for polishing compositions containing abrasive grains each having a surface with protrusions, and as a result, have found that the rate of polishing a hydrophilic object with such a polishing composition is significantly affected by an organic alkali contained in the polishing composition. The present invention has been accomplished based on such new findings obtained by the inventors. It is an objective of the present invention to provide a polishing composition with which a hydrophilic object can be polished at a higher polishing rate, and a polishing method and substrate production method using the polishing composition.

Means for Solving the Problems

In order to achieve the objective described above and in accordance with a first aspect of the present invention, provided is a polishing composition for polishing a surface of a hydrophilic object. The polishing composition contains abrasive grains each having a surface with protrusions. Parts of the abrasive grains have larger particle diameters than the volume-based average particle diameter of the abrasive grains, and the average of values respectively obtained by dividing the height of each protrusion on the surface of each abrasive grain belonging to the parts of the abrasive grains by the width of a base portion of the same protrusion is 0.170 or more. Protrusions on the surfaces of abrasive grains belonging to the parts of the abrasive grains that have larger particle diameters than the volume-based average particle diameter of the abrasive grains have an average height of 3.5 nm or more. The polishing composition has a content of an organic alkali of 100 mmol or less per kilogram of the abrasive grains in the polishing composition.

In the aspect described above, the polishing composition has a pH in the range of preferably plus or minus 2 of the acid dissociation constant pKa value of the organic alkali.

In the aspect described above, the abrasive grains may be colloidal silica. In this case, the colloidal silica has a content of a metallic impurity of preferably 1 ppm by mass or less.

In accordance with a second aspect of the present invention, provided is a method for polishing the surface of an object having a water contact angle of 40° or less, for example, a metal oxide layer with the polishing composition according to the first aspect described above.

In accordance with a third aspect of the present invention, provided is a method for producing a substrate by polishing the surface of an object having a water contact angle of 40° or less with the polishing composition according to the first aspect described above.

Effects of the Invention

The present invention succeeds in providing a polishing composition with which a hydrophilic object can be polished at a high polishing rate, and a polishing method and substrate production method using the polishing composition.

BRIEF DESCRIPTION OF THE DRAWINGS

FIG. 1 is a diagram showing a projected contour of an outer shape of an abrasive grain contained in a polishing composition according to an embodiment of the present invention;

FIG. 2(a) is a scanning electron micrograph of colloidal silica abrasive grains used in polishing compositions of Examples 1 and 2 and Comparative Examples 2 and 3;

FIG. 2(b) is a scanning electron micrograph of colloidal silica abrasive grains used in a polishing composition of Comparative Example 1.

MODES FOR CARRYING OUT THE INVENTION

Figure 3A:
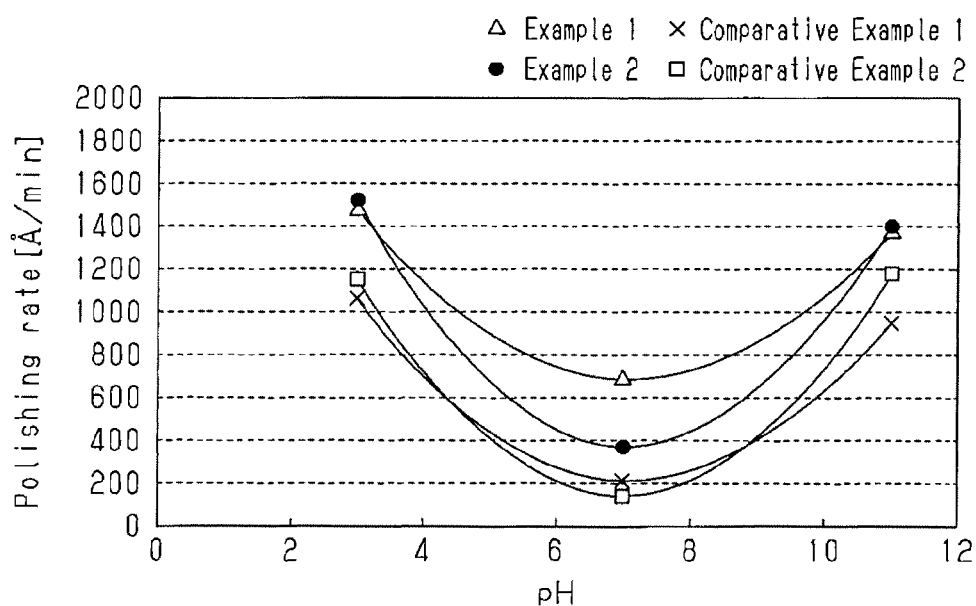
FIGS. 3(a) and 3(b) are graphs showing the relationship between the polishing rate and pH when a silicon oxide layer is polished with each of the polishing compositions of Examples 1 and 2 and Comparative Examples 1 to 3.

One embodiment of the present invention will be described below.

A polishing composition according to the embodiment is used for polishing the surface of a hydrophilic object. More specifically, the polishing composition is used for polishing a metal oxide layer formed on a semiconductor wafer, such as a silicon wafer and compound semiconductor wafer, especially used for polishing a silicon oxide layer formed on a silicon wafer. The silicon oxide layer is a layer composed of a simple or composite oxide of silicon, and specific examples thereof include a TEOS (tetraethyl orthosilicate) layer, a BPSG (borophosphosilicate glass) layer, a PSG (phosphosilicate glass) layer, an SOG (spin on glass) layer, and a thermal oxide layer. The metal oxide layer, however, is not limited to a silicon oxide layer, and examples of other metal oxide layers include a layer composed of a simple or composite oxide of metal such as aluminum, zirconium, titanium, tin, zinc, antimony, indium, magnesium, boron, and niobium. Alternatively, the metal oxide layer may be composed of a metal oxide modified with dopants, such as antimony-doped tin oxide (ATO), fluorine-doped tin oxide, phosphorus-doped tin oxide, tin-doped indium oxide (ITO), and fluorine-doped indium oxide. Degree of hydrophilicity of the object to be polished can be indicated by the water contact angle thereof. The polishing composition of the embodiment is particularly used for polishing the surface of an object having a water contact angle of 40° or less, and more specifically, used for polishing the object to produce a substrate. The water contact angle is typically determined by the θ/2 method and can be determined using, for example, a wafer cleanness and treatment analyzer "CA-X200", manufactured by Kyowa Interface Science Co., Ltd.

The polishing composition of the embodiment contains at least abrasive grains each having a surface with protrusions. When using such odd-shaped abrasive grains, the rate of polishing with the polishing composition is advantageously enhanced as compared with the case where abrasive grains having a non-odd shape, i.e., a spherical shape are used.

The abrasive grains contained in the polishing composition are particles composed of, for example, a metal oxide, diamond, silicon carbide, silicon nitride, or boron nitride, but are not limited thereto. Specific examples of the metal oxide particles include particles composed of any of silica, alumina, zirconia, ceria, titania, and magnesia. Among them, silica particles are preferred and colloidal silica is particularly preferred.

The average number of protrusions that each abrasive grain in the polishing composition has on the surface thereof is preferably 3 or more, and more preferably 5 or more.

A protrusion as referred to herein has a sufficiently small height and width in comparison to the particle diameter of an abrasive grain. Furthermore, a protrusion is such that the length of the portion shown in FIG. 1 as a curve AB passing through a point A and a point B does not exceed a quarter of the circumferential length of the maximum inscribed circle of an abrasive grain, or more specifically, not exceed a quarter of the circumferential length of the maximum circle inscribed in a projected contour of the outer shape of an abrasive grain. The width of a protrusion refers to the width of a base portion of the protrusion, and is expressed in FIG. 1 as the distance between the point A and the point B. The height of a protrusion refers to the distance between a base portion of the protrusion and a portion of the protrusion farthest from the base portion, and is expressed in FIG. 1 as the length of a line segment CD perpendicular to a straight line AB.

Parts of the abrasive grains in the polishing composition have larger particle diameters than the volume-based average particle diameter of the abrasive grains, and the average of values respectively obtained by dividing the height of each protrusion on the surface of each abrasive grain belonging to the parts of the abrasive grains by the width of a base portion of the same protrusion is 0.170 or more, preferably 0.245 or more, and more preferably 0.255 or more. As the average of the above values increases, the rate of polishing with the polishing composition is enhanced because the shapes of the protrusions are relatively sharp. The height of each protrusion of an abrasive grain and the width of a base portion of the protrusion can be determined by using general image analysis software to analyze an image of the abrasive grain taken by a scanning electron microscope.

Protrusions on the surfaces of abrasive grains belonging to the parts of the abrasive grains that have larger particle diameters than the volume-based average particle diameter of the abrasive grains have an average height of 3.5 nm or more, and preferably 4.0 nm or more. As the average height of the protrusions increases, the rate of polishing with the polishing composition is enhanced.

The volume-based average particle diameter of the abrasive grains in the polishing composition is preferably 10 to 300 nm. When the abrasive grains have a volume-based average particle diameter in the range described above, the polishing composition is improved in sedimentation stability, and additionally, it is easy to reduce the surface roughness of an object after being polished with the polishing composition. The volume-based average particle diameter of the abrasive grains represents the particle diameter of an abrasive grain lastly added up when the volume of each abrasive grain is added up in ascending order starting from an abrasive grain having the smallest particle diameter according to the dynamic light scattering method until the added up volume reaches 50% of the sum of all the abrasive grains in the polishing composition.

The volume-based 95% particle diameter (D95 value) of the abrasive grains in the polishing composition is preferably 500 nm or less, and more preferably 400 nm or less. As the volume-based 95% particle diameter of the abrasive grains decreases, the polishing composition is improved in sedimentation stability, and additionally, it is easy to reduce the surface roughness of an object after being polished with the polishing composition. The volume-based 95% particle diameter of the abrasive grains represents the particle diameter of an abrasive grain lastly added up when the volume of each abrasive grain is added up in ascending order starting from an abrasive grain having the smallest particle diameter according to the dynamic light scattering method until the added up volume reaches 95% of the sum of all the abrasive grains in the polishing composition.

The abrasive grains in the polishing composition have a content of a metallic impurity, such as sodium, potassium, calcium, boron, aluminum, titanium, zirconium, manganese, iron, cobalt, copper, zinc, silver, and lead, of preferably 1 ppm by mass or less. The metallic impurity content can be determined by using, for example, an ICP mass spectrometer.

Colloidal silica abrasive grains having protrusions on the surfaces thereof can be prepared, for example, in the following manner. At first, an alkoxysilane is continuously added to a mixed solution of methanol and water in which ammonia water is added as a catalyst, so that the alkoxysilane is hydrolyzed to obtain slurry containing colloidal silica particles. The slurry obtained is heated to distill off the methanol and ammonia. Subsequently, an organic alkali is added as a catalyst to the slurry and then an alkoxysilane is continuously added again to the slurry at a temperature of 70° C. or above, so that the alkoxysilane is hydrolyzed to form protrusions on the surface of each colloidal silica particle. Specific examples of the organic alkali usable include amine compounds, such as triethanolamine, and quaternary ammonium compounds, such as tetramethylammonium hydroxide. According to this process, colloidal silica abrasive grains having a metallic impurity content of 1 ppm by mass or less can be easily obtained.

A general method for preparing colloidal silica through hydrolysis of an alkoxysilane is described in, for example, pp 154 to 156 of "Science of Sol-Gel Method (in Japanese)" written by Sumio Sakka. Japanese Laid-Open Patent Publication No. 11-60232 discloses cocoon-shaped colloidal silica prepared through a reaction of methyl silicate and water by dripping methyl silicate or a mixture of methyl silicate and methanol into a mixed solvent of water, methanol, and ammonia or ammonia and an ammonium salt. Japanese Laid-Open Patent Publication No. 2001-48520 discloses elongated colloidal silica prepared by hydrolyzing an alkyl silicate using an acid catalyst and then adding an alkali catalyst and heating the mixture to make polymerization of silicic acid proceed and make particles grow. Japanese Laid-Open Patent Publication No. 2007-153732 discloses that colloidal silica having a number of small protrusions can be prepared from an easily hydrolyzable organosilicate as a starting material by using a specific type of hydrolysis catalyst in a specific amount. Japanese Laid-Open Patent Publication No. 2002-338232 discloses formation of spherical secondary agglomerate by addition of a flocculating agent to monodisperse colloidal silica. Japanese Laid-Open Patent Publication No. 07-118008 and International Publication No. WO 2007/018069 disclose the addition of a calcium salt or a magnesium salt to active silica obtained from sodium silicate to obtain odd-shaped colloidal silica, such as elongated colloidal silica. Japanese Laid-Open Patent Publication No. 2001-11433 discloses that beaded colloidal silica is obtained by addition of a calcium salt to active silica obtained from sodium silicate. Japanese Laid-Open Patent Publication No. 2008-169102 discloses that colloidal silica having a number of small protrusions like Japanese Confetti can be prepared by forming and growing microparticles on the surfaces of seed particles. Colloidal silica abrasive grains having protrusions on the surfaces thereof can be prepared by employing the method described in each of these documents alone or a plurality thereof in combination.

An organic alkali used as a catalyst upon preparation of the abrasive grains may be inevitably mixed in the polishing composition of the embodiment. Alternatively, an organic alkali may be intentionally added to the polishing composition. In either case, however, the content of an organic alkali in the polishing composition is required to be 100 mmol or less per kilogram of the abrasive grains in the polishing composition. This is because, otherwise, the rate of polishing with the polishing composition would be lowered significantly. Particularly when the polishing composition has a pH close to the value of the acid dissociation constant pKa of the organic alkali, the polishing rate is lowered more significantly. Thus, as the reason for the decrease in the polishing rate due to an organic alkali, it is estimated that the organic alkali dissociated in the polishing composition is adsorbed on the surface of a hydrophilic object to be polished, or more specifically, adsorbed on the surface of a metal oxide layer to be polished. Such estimate is also supported by the fact that the decrease in the polishing rate due to an organic alkali is not observed in the case where the object to be polished is water-repellent like a silicon substrate.

The restriction of the content of an organic alkali in the polishing composition as described above can particularly effectively suppress the decrease in the polishing rate when the pH of the polishing composition is close to the pKa value of the organic alkali, or more specifically, when the polishing composition has a pH in the range of plus or minus 2 of the pKa value of the organic alkali. Such an idea has not been obtained until the inventors of the present invention have found that the rate of polishing a hydrophilic object is particularly lowered when the polishing composition has a pH close to the acid dissociation constant pKa value of the organic alkali. In the case where the organic alkali contained in the polishing composition is triethanolamine, of which pKa value is 7.6, the suppression can be particularly effective when the pH of the polishing composition is in the range of 5.6 to 9.6. In the case where the organic alkali contained in the polishing composition is tetramethylammonium hydroxide, of which pKa value is 9.8, the suppression can be particularly effective when the pH of the polishing composition is in the range of 7.8 to 11.8.

The content of an organic alkali in the polishing composition is preferably 50 mmol or less per kilogram of the abrasive grains in the polishing composition because the rate of polishing a hydrophilic object with the polishing composition is more enhanced. The content of an organic alkali in the polishing composition can be determined by capillary electrophoresis (CE) or capillary electrophoresis-mass spectrometry (CE-MS).

According to the embodiment, the following effects can be obtained.

Parts of the abrasive grains contained in the polishing composition of the embodiment have larger particle diameters than the volume-based average particle diameter of the abrasive grains, and the average of values respectively obtained by dividing the height of each protrusion on the surface of each abrasive grain belonging to the parts of the abrasive grains by the width of a base portion of the same protrusion is 0.170 or more. Protrusions on the surfaces of abrasive grains belonging to the parts of the abrasive grains that have larger particle diameters than the volume-based average particle diameter of the abrasive grains have an average height of 3.5 nm or more. That is, abrasive grains, of the abrasive grains in the polishing composition, having large diameters, which exhibit particularly high mechanical polishing ability, have protrusions with a relatively long and sharp shape. Accordingly, it is possible to polish an object at a high polishing rate with the polishing composition of the embodiment.

In addition, the content of an organic alkali in the polishing composition of the embodiment is 100 mmol or less per kilogram of the abrasive grains in the polishing composition. Despite the fact that polishing a hydrophilic object with the polishing composition is inhibited upon adsorption of an organic alkali on the surface of the object, such restriction of the organic alkali content in the polishing composition can effectively suppress the decrease in the polishing rate due to the organic alkali.

Accordingly, the polishing composition of the embodiment is suitable for use in polishing the surface of a hydrophilic object, or more specifically, in polishing a metal oxide layer.

The embodiment described above may be modified as follows:

The polishing composition of the embodiment described above may further contain a known additive as necessary. The polishing composition may contain, for example, any one of (a) an inorganic alkali, such as an alkali metal hydroxide, an alkali metal salt, ammonia, and an ammonium salt; (b) an inorganic acid, such as hydrochloric acid, phosphoric acid, sulfuric acid, phosphonic acid, nitric acid, phosphinic acid, and boric acid, and an organic acid, such as acetic acid, itaconic acid, succinic acid, tartaric acid, citric acid, maleic acid, glycolic acid, malonic acid, methanesulfonic acid, formic acid, malic acid, gluconic acid, alanine, glycine, lactic acid, hydroxyethylidene diphosphonic acid (HEDP), nitrilotris[methylene phosphonic acid] (NTMP), and phosphonobutane tricarboxylic acid (PBTC); (c) a nonionic, anionic, cationic or amphoteric surfactant; (d) a water-soluble polymer, such as a water-soluble cellulose, a vinyl polymer, and a polyalkylene oxide; (e) a chelating agent, such as a polyamine, a polyphosphonic acid, a polyaminocarboxylic acid, and a polyaminophosphonic acid; (f) an oxidizing agent, such as hydrogen peroxide, a peroxide, an oxo acid, and an acidic metal salt compound; and (g) a fungicide, a disinfectant, a biocide, and other additives.

The polishing composition of the embodiment described above may be prepared by diluting a stock solution of the polishing composition with water.

The polishing composition of the embodiment described above may be used in an application other than polishing a hydrophilic object.

Next, examples and Comparative Examples of the present invention will be described.

EXAMPLE 1

Colloidal silica abrasive grains were mixed in pure water to prepare a polishing composition having a content of colloidal silica abrasive grains of 10.0% by mass. Colloidal silica abrasive grains used had protrusions on each surface thereof as evidenced by the scanning electron micrograph shown in FIG. 2(a). Parts of the colloidal silica abrasive grains had larger particle diameters than the volume-based average particle diameter of the colloidal silica abrasive grains, and protrusions on the surfaces of colloidal silica abrasive grains belonging to the parts of the colloidal silica abrasive grains that has larger particle diameters than the volume-based average particle diameter of the colloidal silica abrasive grains had an average height of 4.25 nm. The average of values respectively obtained by dividing the height of each protrusion on the surface of each colloidal silica abrasive grain belonging to the parts of the abrasive grains that have larger particle diameters than the volume-based average particle diameter of the colloidal silica abrasive grains by the width of a base portion of the same protrusion was 0.310. The volume-based average particle diameter of the colloidal silica abrasive grains was 85 nm. The volume-based 95% particle diameter of the colloidal silica abrasive grains was 116 nm. The metallic impurity content of the colloidal silica abrasive grains was less than 1 ppm. The pH of the obtained polishing composition measured 7.0. Triethanolamine used as a catalyst upon preparation of the colloidal silica abrasive grains was inevitably mixed in the polishing composition and the content thereof measured 5 mmol per kilogram of the colloidal silica abrasive grains in the polishing composition.

EXAMPLE 2

Triethanolamine was added to the polishing composition of Example 1 so that the content of the organic alkali in the polishing composition was increased up to 50 mmol per kilogram of the colloidal silica abrasive grains in the polishing composition. The pH of the polishing composition measured 8.5 after the addition of triethanolamine.

COMPARATIVE EXAMPLE 1

Colloidal silica abrasive grains were mixed in pure water to prepare a polishing composition having a content of colloidal silica abrasive grains of 10.0% by mass. Colloidal silica abrasive grains used had no protrusions on each surface thereof as evidenced by the scanning electron micrograph shown in FIG. 2(b). The volume-based average particle diameter of the colloidal silica abrasive grains was 131 nm. The volume-based 95% particle diameter of the colloidal silica abrasive grains was 212 nm. The metallic impurity content of the colloidal silica abrasive grains was less than 1 ppm. The pH of the obtained polishing composition measured 7.5. No organic alkalis at a detectable level were contained in this polishing composition.

COMPARATIVE EXAMPLE 2

Triethanolamine was added to the polishing composition of Example 1 so that the content of the organic alkali in the polishing composition was increased up to 140 mmol per kilogram of the colloidal silica abrasive grains in the polishing composition. The pH of the polishing composition measured 8.9 after the addition of triethanolamine.

COMPARATIVE EXAMPLE 3

Tetramethylammonium hydroxide was added to the polishing composition of Example 1 so that the content of the organic alkali in the polishing composition was increased up to 140 mmol per kilogram of the colloidal silica abrasive grains in the polishing composition. The pH of the polishing composition measured 9.7 after the addition of triethanolamine.

Lactic acid or potassium hydroxide was added to each of the polishing compositions of Examples 1 and 2 and Comparative Examples 1 to 3 to adjust the pH of the polishing composition to 3.0, 7.0, or 11.0. A silicon wafer having a silicon oxide layer on the surface thereof, specifically the surface of a PE-TEOS (plasma-enhanced tetraethyl orthosilicate) blanket wafer with a diameter of 50.8 mm, was polished with each of the thus obtained polishing compositions under the conditions shown in Table 1. In each polishing run, a polishing rate value obtained according to the calculation formula below is shown in Table 2 and FIGS. 3(a) and 3(b).

Polishing rate [Å/min]=Difference in weight of
wafer between before and after polishing [g]/
polishing time [min]/wafer surface area [cm$^2$]
(=20.26 cm$^2$)/true density of TEOS layer
[g/cm$^3$](=2.2 g/cm$^3$)×10$^8$

TABLE 1

Polishing machine: "CP-4", manufactured by CETR Inc.
Polishing pad: "IC1000 A2 PAD DD1 (kgrv)", manufactured by Nitta Haas Inc.
Head rotational speed: 300 rpm
Platen rotational speed: 300 rpm
Linear velocity: 113 m/min
Feeding rate of polishing composition: 13 mL/min
Polishing time: 1 min
Polishing pressure: 20.69 kPa

TABLE 2

|  | Polishing rate at pH 3.0 [Å/min] | Polishing rate at pH 7.0 [Å/min] | Polishing rate at pH 11.0 [Å/min] |
| --- | --- | --- | --- |
| Example 1 | 1491 | 695 | 1390 |
| Example 2 | 1525 | 370 | 1402 |
| Comparative Example 1 | 1065 | 213 | 953 |
| Comparative Example 2 | 1150 | 147 | 1185 |
| Comparative Example 3 | 1450 | 706 | 561 |

As shown in Table 2 and FIG. 3(a), the polishing rates obtained when using the polishing composition of Example 1 or 2 were high regardless of the pH as compared with the polishing rates obtained when using the polishing composition of Comparative Example 1, in which the abrasive grains have no protrusions on the surfaces thereof. In addition, the polishing rates obtained when using the polishing composition of Example 1 or 2 were also high regardless of the pH as compared with the polishing rates obtained when using the polishing composition of Comparative Example 2, in which the triethanolamine content exceeds 100 mmol per kilogram of the colloidal silica abrasive grains.

Figure 3B:
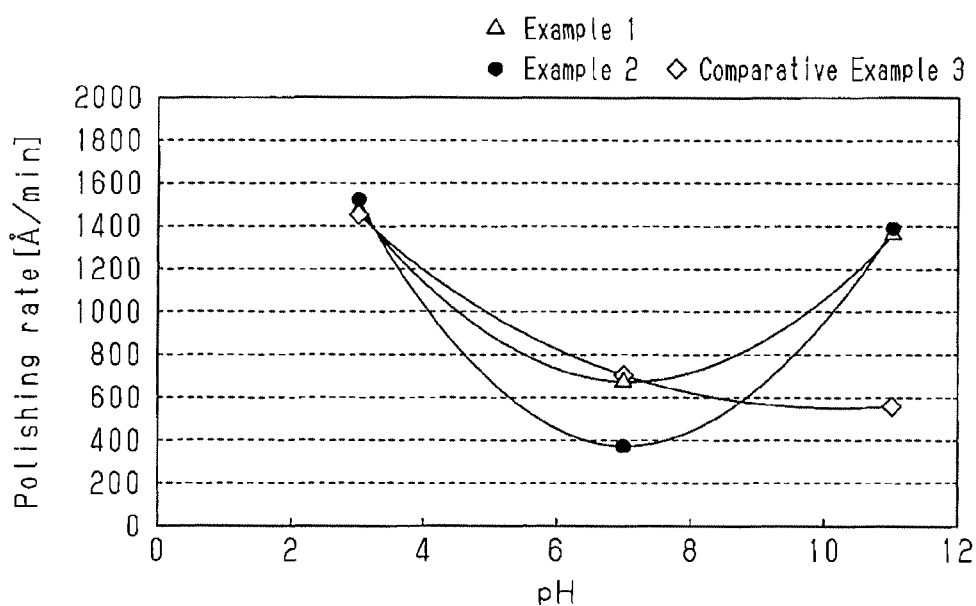

As shown in Table 2 and FIG. 3(b), the polishing rates obtained when using the polishing composition of Example 1 or 2 were high at least at the pH of 11.0 as compared with the polishing rates obtained when using the polishing composition of Comparative Example 3, in which the tetramethylammonium hydroxide content exceeds 100 mmol per kilogram of the colloidal silica abrasive grains.

The invention claimed is:

1. A method comprising:
   mixing abrasive grains with water to prepare a polishing composition; and
   adding an organic alkali to the polishing composition such that the organic alkali is contained in the polishing composition in an amount of 100 mmol or less per kilogram of the abrasive grains in the polishing composition, wherein
   the abrasive grains each have a surface with a plurality of protrusions,
   parts of the abrasive grains have larger particle diameters than a volume-based average particle diameter of the abrasive grains, and an average of values respectively obtained by dividing a height of each protrusion on a surface of each abrasive grain belonging to the parts of the abrasive grains by a width of a base portion of the same protrusion is 0.170 or more, and
   protrusions on surfaces of abrasive grains belonging to the parts of the abrasive grains that have larger particle diameters than the volume-based average particle diameter of the abrasive grains have an average height of 3.5 nm or more.

2. The method according to claim 1, wherein the polishing composition has a pH in the range of plus or minus 2 of an acid dissociation constant pKa value of the organic alkali.

3. The method according to claim 1, wherein the abrasive grains are colloidal silica that has a content of a metallic impurity of 1 ppm by mass or less.

4. A method for polishing, comprising:
   providing an object having a water contact angle of 40° or less;
   preparing, in accordance with the method according to claim 1, a polishing composition in which an organic alkali has been added; and
   using the polishing composition to polish a surface of the object.

5. The method for polishing according to claim 4, wherein the object to be polished is a metal oxide layer.

6. A method for producing a substrate, comprising:
   providing an object having a water contact angle of 40° or less;
   preparing, in accordance with the method according to claim 1, a polishing composition in which an organic alkali has been added; and
   using the polishing composition to produce a substrate by polishing a surface of the object.

7. The method according to claim 2, wherein the abrasive grains are colloidal silica that has a content of a metallic impurity of 1 ppm by mass or less.

8. The method according to claim 4, wherein the polishing composition has a pH in the range of plus or minus 2 of an acid dissociation constant pKa value of the organic alkali.

9. The method according to claim 4, wherein the abrasive grains are colloidal silica that has a content of a metallic impurity of 1 ppm by mass or less.

10. The method according to claim 6, wherein the polishing composition has a pH in the range of plus or minus 2 of an acid dissociation constant pKa value of the organic alkali.

11. The method according to claim 6, wherein the abrasive grains are colloidal silica that has a content of a metallic impurity of 1 ppm by mass or less.

12. The method according to claim 1, further comprising adding an additive other than the organic alkali to the polishing composition.

\* \* \* \* \*